US010850632B2

(12) United States Patent
Senba

(10) Patent No.: US 10,850,632 B2
(45) Date of Patent: Dec. 1, 2020

(54) POWER SUPPLY SYSTEM FOR VEHICLE, AND CONTROL METHOD OF POWER SUPPLY SYSTEM

(71) Applicant: TOYOTA JIDOSHA KABUSHIKI KAISHA, Toyota (JP)

(72) Inventor: Hiromichi Senba, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 16/184,281

(22) Filed: Nov. 8, 2018

(65) Prior Publication Data

US 2019/0176631 A1    Jun. 13, 2019

(30) Foreign Application Priority Data

Dec. 13, 2017 (JP) .................................. 2017-238904

(51) Int. Cl.
*B60L 11/18*    (2006.01)
*B60L 53/24*    (2019.01)
(Continued)

(52) U.S. Cl.
CPC .............. *B60L 53/24* (2019.02); *B60L 1/003* (2013.01); *B60L 1/02* (2013.01); *B60L 58/10* (2019.02);
(Continued)

(58) Field of Classification Search
CPC .. B60L 53/24; B60L 1/003; B60L 1/02; B60L 58/10; B60L 2270/525;
(Continued)

(56) References Cited

U.S. PATENT DOCUMENTS 7,867,662 B2 *  1/2011  Ojima ............... H01M 8/04559
429/432
9,437,889 B2 *  9/2016  Moses ................. H01M 8/0488
(Continued)

FOREIGN PATENT DOCUMENTS

CN      104216439 A    12/2014
JP      2007302129 A   11/2007
(Continued)

OTHER PUBLICATIONS

Sep. 3, 2019 Notice of Allowance issued in U.S. Appl. No. 16/179,240.
U.S. Appl. No. 16/179,240, filed Nov. 2, 2018.

*Primary Examiner* — Jared Fureman
*Assistant Examiner* — Emmanuel Dominique
(74) *Attorney, Agent, or Firm* — Oliff PLC

(57) ABSTRACT

A power supply system for a vehicle includes: a main power supply; an electric power converter including a capacitor; a relay; a sub power supply; a boost converter; a cooler; and a controller configured to cause the sub power supply and the boost converter to precharge the capacitor, when a main switch of the vehicle is turned on and before the relay is closed to connect the electric power converter to the main power supply. The controller is configured to perform one of a control i) and a control ii) when one of a temperature of the boost converter and a temperature of a coolant in the cooler is higher than a specified temperature threshold. The control i) being a control to start the precharging while starting up the cooler. The control ii) being a control to start up the cooler before the precharging.

3 Claims, 5 Drawing Sheets

(51) Int. Cl.
*H05K 7/20* (2006.01)
*B60L 58/10* (2019.01)
*B60L 1/02* (2006.01)
*B60L 1/00* (2006.01)
*H02J 7/00* (2006.01)
*H02J 7/34* (2006.01)

(52) U.S. Cl.
CPC ............ *H02J 7/00* (2013.01); *H05K 7/20872* (2013.01); *H05K 7/20927* (2013.01); *H05K 7/20945* (2013.01); *B60L 2210/14* (2013.01); *B60L 2240/525* (2013.01); *B60L 2240/527* (2013.01); *B60L 2270/142* (2013.01); *B60L 2270/20* (2013.01); *H02J 7/345* (2013.01); *H02J 2207/20* (2020.01)

(58) Field of Classification Search
CPC ........... B60L 2240/527; B60L 2270/20; B60L 2210/14; B60L 2270/142; H02J 7/00; H02J 2207/20; H02J 7/345; H05K 7/20872; H05K 7/20927; H05K 7/20945
See application file for complete search history.

(56) References Cited

U.S. PATENT DOCUMENTS

| | | | |
|---|---|---|---|
| 10,498,134 B2* | 12/2019 | Nozawa | B60L 1/02 |
| 2010/0138087 A1* | 6/2010 | Takaoka | B60L 53/65 |
| | | | 701/22 |
| 2010/0321889 A1* | 12/2010 | Yoshino | H05K 7/20927 |
| | | | 361/702 |
| 2014/0358341 A1 | 12/2014 | Jeon et al. | |
| 2016/0114788 A1* | 4/2016 | Kamatani | B60L 50/11 |
| | | | 701/22 |
| 2016/0152150 A1* | 6/2016 | Taguchi | B60L 58/12 |
| | | | 307/10.1 |
| 2017/0113567 A1 | 4/2017 | Koketsu et al. | |
| 2017/0251575 A1* | 8/2017 | Nakamura | H01F 27/08 |
| 2017/0355272 A1* | 12/2017 | Baba | B60K 6/22 |
| 2019/0181633 A1 | 6/2019 | Nozawa | |

FOREIGN PATENT DOCUMENTS

| | | |
|---|---|---|
| JP | 2017-030408 A | 2/2017 |
| JP | 2017-085869 A | 5/2017 |

\* cited by examiner

POWER SUPPLY SYSTEM FOR VEHICLE, AND CONTROL METHOD OF POWER SUPPLY SYSTEM

INCORPORATION BY REFERENCE

The disclosure of Japanese Patent Application No. 2017-238904 filed on Dec. 13, 2017 including the specification, drawings and abstract is incorporated herein by reference in its entirety.

BACKGROUND

1. Technical Field

The present specification discloses a technique relating to a power supply system mounted on a vehicle, and a control method of the power supply system. The present specification particularly relates to a power supply system mounted on an electric vehicle to supply drive electric power to a traveling motor. In the present specification, the term "electric vehicle" includes a hybrid vehicle including both a motor and an engine, and a vehicle having a fuel cell as a power supply.

2. Description of Related Art

Electric vehicles are mounted with a power supply system that supplies drive electric power to a traveling motor. For example, such a power supply system is disclosed in Japanese Patent Application Publication No. 2017-030408 (JP 2017-030408 A). The power supply system includes a power supply and an electric power converter that converts electric power of the power supply into drive electric power of the motor. Between the power supply and the electric power converter, a relay (system main relay) is provided. When a main switch of the vehicle is turned on, the system main relay is closed to connect the electric power converter to the power supply. When the main switch of the vehicle is turned off, the system main relay is released to disconnect the electric power converter from the power supply.

Meanwhile, the electric power converter includes a capacitor that smooths an electric current (voltage) supplied from the power supply. Since the power supply has a large output that is for drive electric power of the traveling motor, a large-capacity capacitor is adopted for smoothing. When the system main relay is closed to connect the power supply and the electric power converter while the amount of electric power remaining in the capacitor is small, a large electric current (surge current) flows into the capacitor. As a result, a load is applied to the capacitor or to electrical components that are electrically connected to the capacitor.

Accordingly, in the power supply system of JP 2017-030408 A, the capacitor is charged before the system main relay is closed. Charging of the capacitor performed before charging of the system main relay is referred to as "precharging" in the present specification. Closing the system main relay after a moderate amount of electric power is accumulated in the capacitor alleviates a surge current flowing into the capacitor from the power supply. The system main relay is typically switched from an opened state to a closed state when the main switch of the vehicle is turned on.

SUMMARY

An electric vehicle includes a power supply (main power supply) for a traveling motor having a drive voltage of 100 volts or more, and also a sub power supply for electric appliances having a drive voltage of 10 volts to 50 volts. When the sub power supply is used for precharging a capacitor of the electric power converter, a boost converter for boosting the voltage of the sub power supply is needed. Since the boost converter generates heat, the power supply system includes a cooler that cools the boost converter and other devices.

When the vehicle travels with a high load, the temperature of the boost converter is kept high for a while even after the main switch is switched to an OFF state. When the main switch of the vehicle is turned on in that state, the boost converter is overheated, as a result of which a heat load is applied to the components of the boost converter. An aspect of the present disclosure cools the boost converter when the temperature of the boost converter is high, and precharges the boost converter without increasing the heat load of the boost converter.

A first aspect of the present disclosure relates to a power supply system for a vehicle. The power supply system includes: a main power supply; an electric power converter including a capacitor connected between a positive electrode of the main power supply and a negative electrode of the main power supply, the electric power converter being configured to convert an output electric power of the main power supply; a relay configured to switch connection and disconnection between the electric power converter and the main power supply; a sub power supply having an output voltage lower than an output voltage of the main power supply; a boost converter including a low voltage end connected to the sub power supply and a high voltage end connected to the capacitor; a cooler configured to cool the boost converter; and a controller configured to cause the sub power supply and the boost converter to precharge the capacitor when a main switch of the vehicle is turned on, such that the sub power supply and the boost converter to precharge the capacitor before the relay is closed to connect the electric power converter to the main power supply. The controller is configured to perform one of a control i) and a control ii) when one of a temperature of the boost converter and a temperature of a coolant in the cooler is higher than a specified temperature threshold. The control i) is a control to start the precharging while starting up the cooler. The control ii) is control to start up the cooler before the precharging.

With the above configuration, when the main switch is turned on, and the temperature of the boost converter is high, the cooler is started up to cool the boost converter. The power supply system can precharge the capacitor without causing excessive increase in heat load of the boost converter.

In the power supply system, the controller may be configured to perform one of the control i) and the control ii) when a condition a) and a condition b) are both satisfied. The condition a) may be a condition that one of a temperature of the boost converter and a temperature of the coolant when the main switch was turned off last time is higher than the temperature threshold. The condition b) may be a condition that lapsed time after the main switch was turned off last time is shorter than a specified threshold time. With the configuration, it is not necessary to acquire a measurement value of a temperature sensor, and the cooler can be started up by a determination process inside a controller. This makes it possible to start up the cooler at early timing as necessary, and to swiftly lower the temperature of the boost converter at the time of precharging. In place of the temperature of the coolant, the controller may use the temperature of a cooling object of the cooler as an approximation value of the temperature of the coolant.

A second aspect of the present disclosure relates to a control method of a power supply system. The power supply system includes: a main power supply; an electric power converter including a capacitor connected between a positive electrode of the main power supply and a negative electrode of the main power supply, the electric power converter being configured to convert output electric power of the main power supply; a relay configured to switch connection and disconnection between the electric power converter and the main power supply; a sub power supply having an output voltage lower than an output voltage of the main power supply; a boost converter including a low voltage end connected to the sub power supply and a high voltage end connected to the capacitor; a cooler configured to cool the boost converter; and a controller configured to cause the sub power supply and the boost converter to precharge the capacitor when a main switch is turned on, such that the sub power supply and the boost converter to precharge the capacitor before the relay is closed to connect the electric power converter to the main power supply. The control method includes performing, by the controller, one of a control i) and a control ii) when one of a temperature of the boost converter and a temperature of a coolant in the cooler is higher than a specified temperature threshold. The control i) is a control to start the precharging while starting up the cooler. The control ii) is a control to start up the cooler before the precharging.

With the configuration, when the main switch is turned on and the temperature of the boost converter is high, the cooler is started up to cool the boost converter. The power supply system can precharge the capacitor without causing excessive increase in heat load of the boost converter.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein.

DETAILED DESCRIPTION OF EMBODIMENTS

Figure 1:
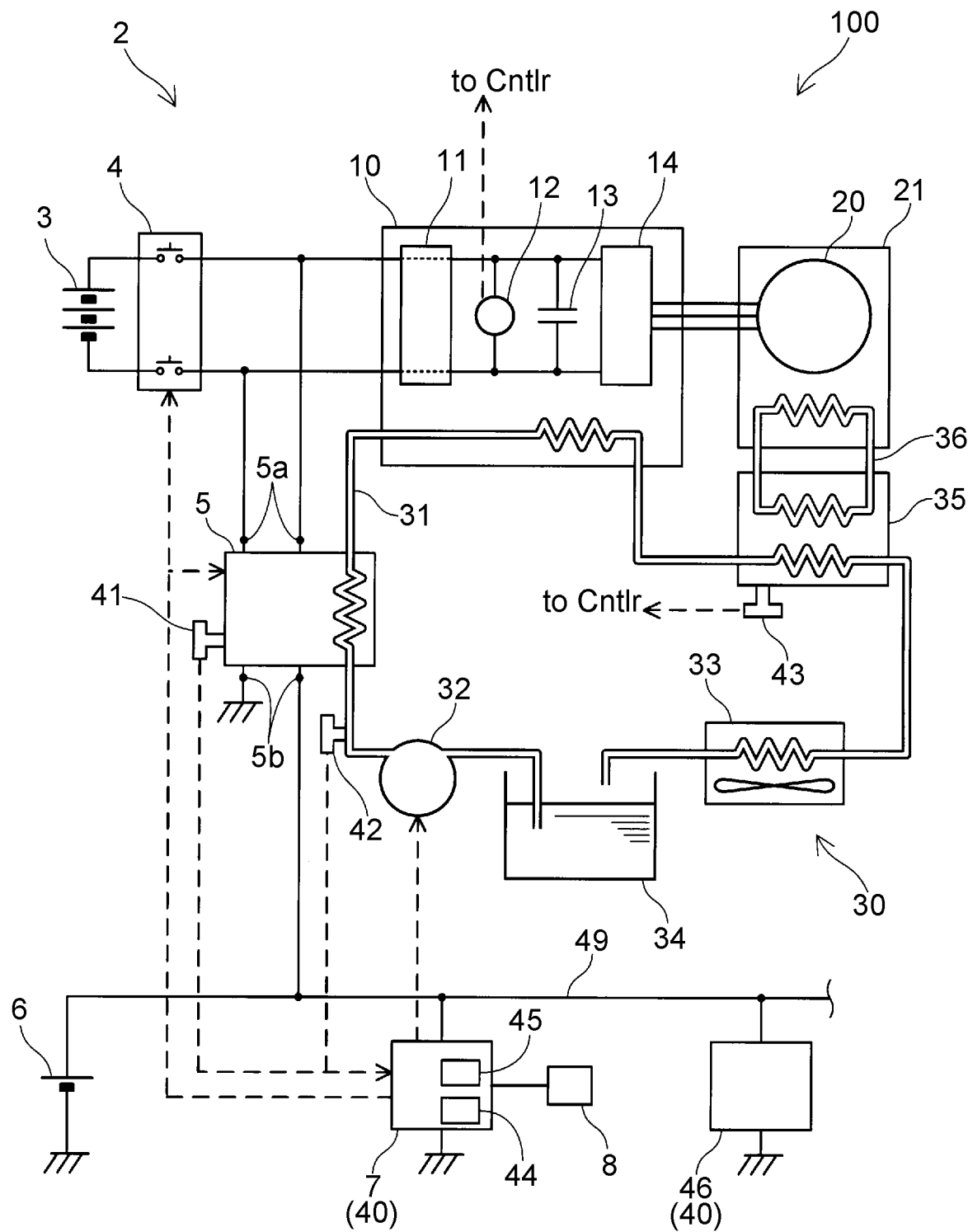
FIG. 1 is a block diagram of an electric power system for an electric vehicle including a power supply system of an embodiment.

A power supply system 2 of an embodiment will be described with reference to the drawings. The power supply system 2 of the embodiment is mounted on an electric vehicle 100. FIG. 1 is block diagram illustrating an electric power system of the electric vehicle 100 including the power supply system 2. In FIG. 1, broken arrow lines represent signal lines. A character string "to Cntlr" means "to controller 7" (to Controller)". Solid lines connecting devices represent transfer routes of electric power. The electric vehicle 100 of the embodiment includes the power supply system 2, a traveling motor 20, and a main switch 8. The electric vehicle 100 travels with the motor 20.

The power supply system 2 includes a main battery 3, a system main relay 4, a sub-battery 6, an electric power converter 10, a boost converter 5, a controller 7, and a cooler 30. The power supply system 2 supplies drive electric power to the motor 20, while supplying electric power to auxiliary machines, such as a car navigation 46. Here, the term "auxiliary machines" is a general term of electric appliances that operate at voltages lower than the voltage of the drive electric power of the motor 20. The controller 7 of the power supply system 2 is also one of the auxiliary machines. The vehicle is mounted with various auxiliary machines besides the devices illustrated in FIG. 1. Hereinafter, devices such as the controller 7 and the car navigation 46 may collectively be referred to as auxiliary machines 40.

The motor 20 has a drive voltage of, for example, 200 volts to 600 volts, and the auxiliary machines 40 have a drive voltage of 12 volts, for example. The main battery 3 has an output voltage of 200 volts, and the sub-battery 6 has an output voltage equal to the drive voltage (12 volts) of the auxiliary machines 40. An auxiliary machine electric power line 49 is spread all over the body of the electric vehicle 100. The auxiliary machine electric power line 49 is connected to the controller 7, the car navigation 46, as well as to various unillustrated auxiliary machines and the sub-battery 6. The negative electrodes of the auxiliary machines 40 and the negative electrode of the sub-battery 6 are connected through the ground.

The electric power converter 10 converts the electric power of the main battery 3 into the drive electric power of the motor 20. The electric power converter 10 includes a voltage converter 11, an inverter 14, a smoothing capacitor 13, and a voltage sensor 12. The voltage converter 11 boosts the output voltage of the main battery 3 to the drive voltage of the motor 20. The inverter 14 converts the boosted direct-current electric power into alternating-current electric power with a frequency suitable for driving of the motor 20. The direct-current electric power of the main battery 3 is boosted with the electric power converter 10. The direct-current electric power is further converted into alternating-current electric power and is supplied to the motor 20.

The smoothing capacitor 13 is connected in parallel between the voltage converter 11 and the inverter 14. The smoothing capacitor 13 suppresses pulsation of the electric current flowing between the voltage converter 11 and the inverter 14. An input terminal and an output terminal of the voltage converter 11 are electrically connected on a constant basis, and the smoothing capacitor 13 is connected between the positive electrode and the negative electrode of the main battery 3. In FIG. 1, illustration of the circuit configuration of the voltage converter 11 and the inverter 14 is omitted. Dotted lines in a square shape representing the voltage converter 11 schematically illustrates constant electric connection between the input terminal and the output terminal of the voltage converter 11.

The system main relay 4 is connected between the main battery 3 and the electric power converter 10. The system main relay 4 is a switch for switching connection and disconnection between the main battery 3 and the electric power converter 10. The system main relay 4 is controlled by the controller 7. While the system main relay 4 is closed to connect the electric power converter 10 with the main battery 3, the smoothing capacitor 13 is charged by the main battery 3.

The electric power converter 10 also includes the voltage sensor 12. The voltage sensor 12 measures the voltage of the smoothing capacitor 13. The measured voltage is sent to the controller 7.

The boost converter 5 has a high voltage end 5a that is connected to the electric power converter 10 side of the system main relay 4. In other words, the high voltage end 5a is connected with the smoothing capacitor 13 without using the system main relay 4. Therefore, the high voltage end 5a of the boost converter 5 is constantly connected with the smoothing capacitor 13. The boost converter 5 has a low voltage end 5b that is connected with the sub-battery 6 through the auxiliary machine electric power line 49. The boost converter 5 can boost the voltage of the sub-battery 6, and supply the boosted voltage to the smoothing capacitor 13. In other words, the smoothing capacitor 13 is charged by the sub-battery 6 and the boost converter 5.

The boost converter 5 also has a voltage step-down function for stepping down the voltage of the electric power input into the high voltage end 5a, and supplying the stepped-down electric power to the sub-battery 6. In the present specification, attention is paid to the boosting function of the boost converter 5, and therefore description of the voltage step-down function is omitted.

A description is given of the cooler 30 of the power supply system 2. The cooler 30 cools the boost converter 5, the electric power converter 10, and the oil cooler 35. The cooler 30 includes a coolant circulation path 31, a pump 32, a radiator 33, and a reserve tank 34. The coolant circulation path 31 extends through the boost converter 5, the electric power converter 10, the oil cooler 35, and the radiator 33 to cool the respective devices. The coolant flowing through the coolant circulation path 31 is liquid, which is typically water.

The oil cooler 35 is a device that cools a coolant oil that cools the motor 20. The coolant oil flows through an oil circulation path 36. The oil circulation path 36 extends through a motor housing 21 that houses the motor 20, and the oil cooler 35 to circulate the coolant oil therebetween. The coolant oil absorbs the heat of the motor 20 inside the motor housing 21, which increases the temperature of the coolant oil. The coolant oil with increased temperature is cooled in the oil cooler 35 by the coolant flowing through the coolant circulation path 31 of the cooler 30. The coolant oil cooled in the oil cooler 35 flows again to the motor housing 21, and cools the motor 20. When the motor housing 21 also houses a gear set, the coolant oil may be an automatic transmission fluid (ATF).

The coolant circulation path 31 extends from the reserve tank 34 to the boost converter 5, the electric power converter 10, the oil cooler 35, and the radiator 33 in this order, and returns to the reserve tank 34 again. The coolant circulation path 31 makes the coolant flow in the aforementioned order, and makes the coolant return to the reserve tank 34. The coolant is pumped with the pump 32. The pump 32 is controlled by the controller 7.

The cooler 30 includes temperature sensors 41, 42, 43. The temperature sensor 41 measures the temperature of the boost converter 5. The temperature sensor 42 measures the temperature of the coolant coming out of the pump 32. The temperature sensor 43 measures the temperature of the oil cooler 35. The measurement values of the temperature sensors 41, 42, 43 are sent to the controller 7. The controller 7 controls the pump 32 based on the measurement values of the temperature sensors 41 to 43. Changing the output of the pump 32 can regulate the flow rate of the coolant flowing through the coolant circulation path 31.

The controller 7 includes a central processing unit (CPU) 44 and a memory 45. Hereinafter, the central processing unit 44 is referred to as the CPU 44 for convenience of description. The memory 45 stores various programs. When the CPU 44 executes various kinds of programs stored in the memory 45, functions described in the programs are implemented. Precharging described below is also implemented when the CPU 44 executes a precharge program stored in the memory 45.

A description is given of precharging. The controller 7 is connected to the main switch 8 of the vehicle. The main switch 8 is also called a power switch or an ignition switch of the vehicle. When the main switch 8 is turned on, the controller 7 closes the system main relay 4 to connect the main battery 3 to the electric power converter 10. When the main battery 3 is connected to the electric power converter 10, the electric vehicle 100 is put in a travelable state. When the main switch 8 is turned off, the controller 7 releases the system main relay 4 to separate the electric power converter 10 from the main battery 3. An unexpected electric leakage can be prevented by separating the electric power converter 10 from the main battery 3.

As described before, when the system main relay 4 is closed, the electric power converter 10 is connected to the main battery 3, and the smoothing capacitor 13 of the electric power converter 10 is in a state connected with the main battery 3. The smoothing capacitor 13 has a large capacity, and when the system main relay 4 is closed while the amount of charges remaining in the smoothing capacitor 13 is small, a surge current flows into the smoothing capacitor 13 from the main battery 3. The surge current may damage the electrical components of the electric power converter 10. Accordingly, the controller 7 charges the smoothing capacitor 13, before closing the system main relay 4 and connecting the electric power converter 10 with the main battery 3. This charging operation is called precharging. The precharging is achieved by the sub-battery 6 and the boost converter 5. The controller 7 controls the boost converter 5 to execute the precharging.

When the main switch 8 is turned on, the controller 7 starts up the boost converter 5, and precharges the smoothing capacitor 13 using the electric power of the sub-battery 6, before closing the system main relay 4. However, in the case where the temperature of the boost converter 5 is high when the main switch 8 is turned on, starting up the boost converter 5 for precharging may cause further increase in temperature of the boost converter 5 and cause the components to be damaged. Alternatively, when the boost converter 5 is overheated, the controller 7 may restrict the operation of the boost converter 5 for protection of the components. That is, if precharging is performed while the temperature of the boost converter 5 is high, there is a possibility that a high heat load may be applied to the boost converter 5. Accordingly, the controller 7 checks the temperature of the boost converter 5 before the start of precharging. When the temperature of the boost converter 5 is high, the controller 7 starts up the cooler 30 to lower the temperature of the boost converter 5 before precharging of the smoothing capacitor 13. Alternatively, when the temperature of the boost converter 5 is high, the controller 7 starts up the cooler 30 concurrently with precharging so as to prevent the boost converter 5 from overheating during precharging.

Figure 2:
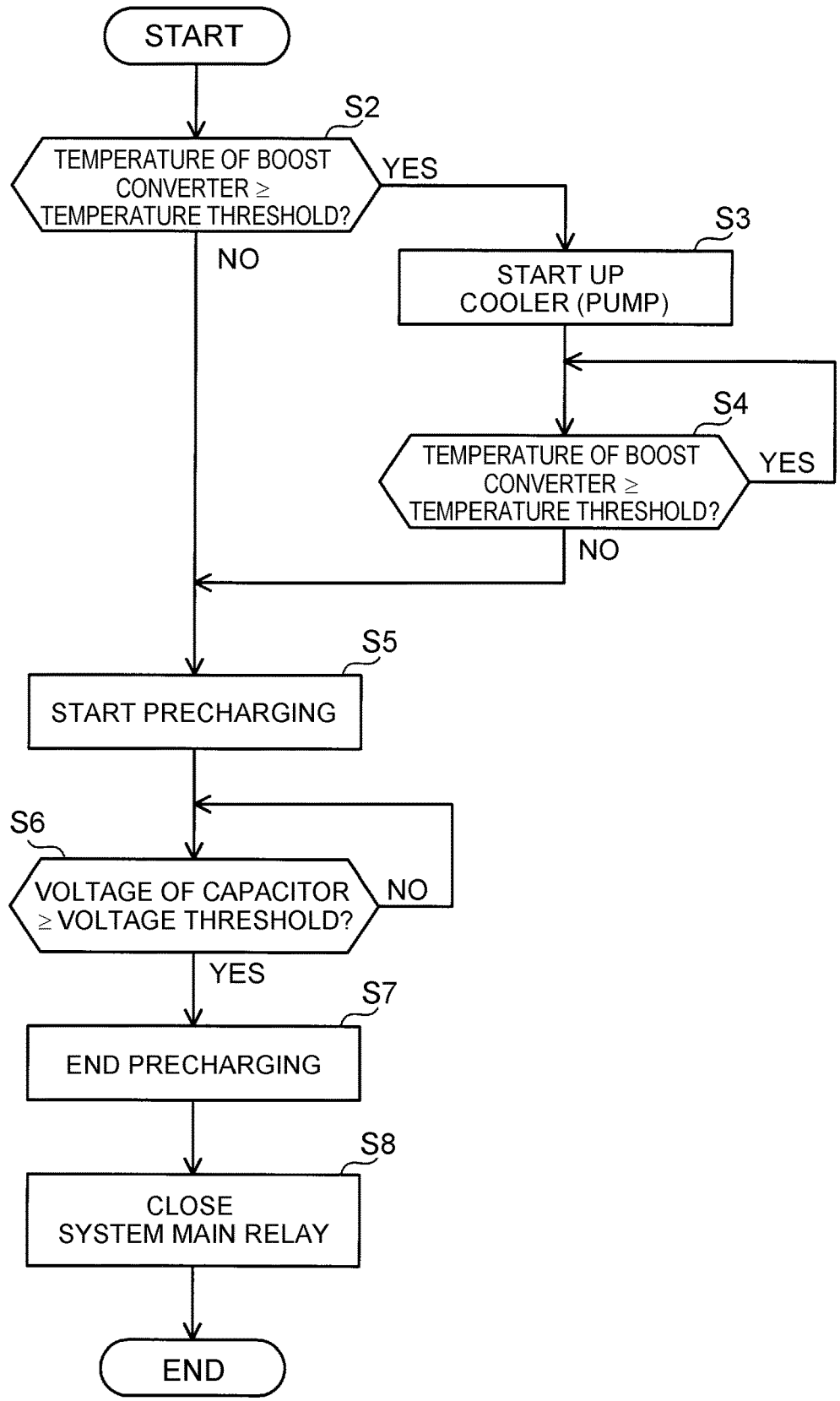
FIG. 2 is a flowchart of a precharging process executed by a controller.

FIG. 2 illustrates a flowchart of a precharging process executed by the controller 7. When the main switch 8 is turned on, the controller 7 starts the process of FIG. 2. First, the controller 7 checks the temperature (that is, a measurement value of the temperature sensor 41) of the boost converter 5 (step S2). When the temperature of the boost converter 5 is lower than a specified temperature threshold (step S2: NO), the controller 7 immediately starts up the boost converter 5, and starts precharging (step S5). The controller 7 acquires a voltage across the smoothing capacitor 13 from the voltage sensor 12, and compares the voltage with a specified voltage threshold (step S6). The voltage threshold is set to a value close to the output voltage of the main battery 3, for example, 80% of the output voltage of the main battery 3. The controller 7 continues precharging until the voltage across the smoothing capacitor 13 exceeds the voltage threshold (step S6: NO). When the voltage across the smoothing capacitor 13 exceeds the voltage threshold (step S6: YES), the controller 7 stops the boost converter 5 and ends precharging (step S7). Finally, the controller 7 closes the system main relay 4 to connect the main battery 3 to the electric power converter 10 (step S8). Since the smoothing capacitor 13 is charged up to 80% of the output voltage of the main battery 3 when the main battery 3 is connected to the electric power converter 10, a large current surge does not arise.

When the temperature of the boost converter 5 exceeds the temperature threshold in the process of step S2, (step S2: YES), the controller 7 starts up the cooler 30 (step S4). Specifically, the controller 7 starts up the pump 32. The pump 32 is also one of the auxiliary machines, and operates upon reception of electric power supplied from the sub-battery 6 although illustration thereof is omitted.

After starting up the cooler 30, the controller 7 waits until the temperature of the boost converter 5 becomes less than the temperature threshold (step S4: YES). When the temperature of the boost converter 5 is less than the temperature threshold, the controller 7 starts up the boost converter 5, and starts precharging (step S4: NO, S5). A subsequent process (steps S5 to S8) is as described before.

In the power supply system 2 of the first embodiment, when the temperature of the boost converter 5 is high after the main switch 8 is turned on, the cooler 30 is started up. Once the temperature of the boost converter 5 is lowered, precharging is started (step S2: YES, S3). Hence, it is avoided that the heat load of the boost converter 5 increases in the midst of precharging. The controller 7 does not start up the cooler 30, when the temperature of the boost converter 5 is lower than the temperature threshold (step S2: NO, S5). The controller 7 starts precharging without starting up the cooler 30, when the temperature of the boost converter 5 is low. Hence, the power supply system 2 can avoid useless electric power consumption. When the cooler 30 (pump 32) is started up, the pump 32 generates noise. Since the power supply system 2 does not start up the pump 32 when the temperature of the boost converter 5 is low, generation of noise is prevented.

Figure 3:
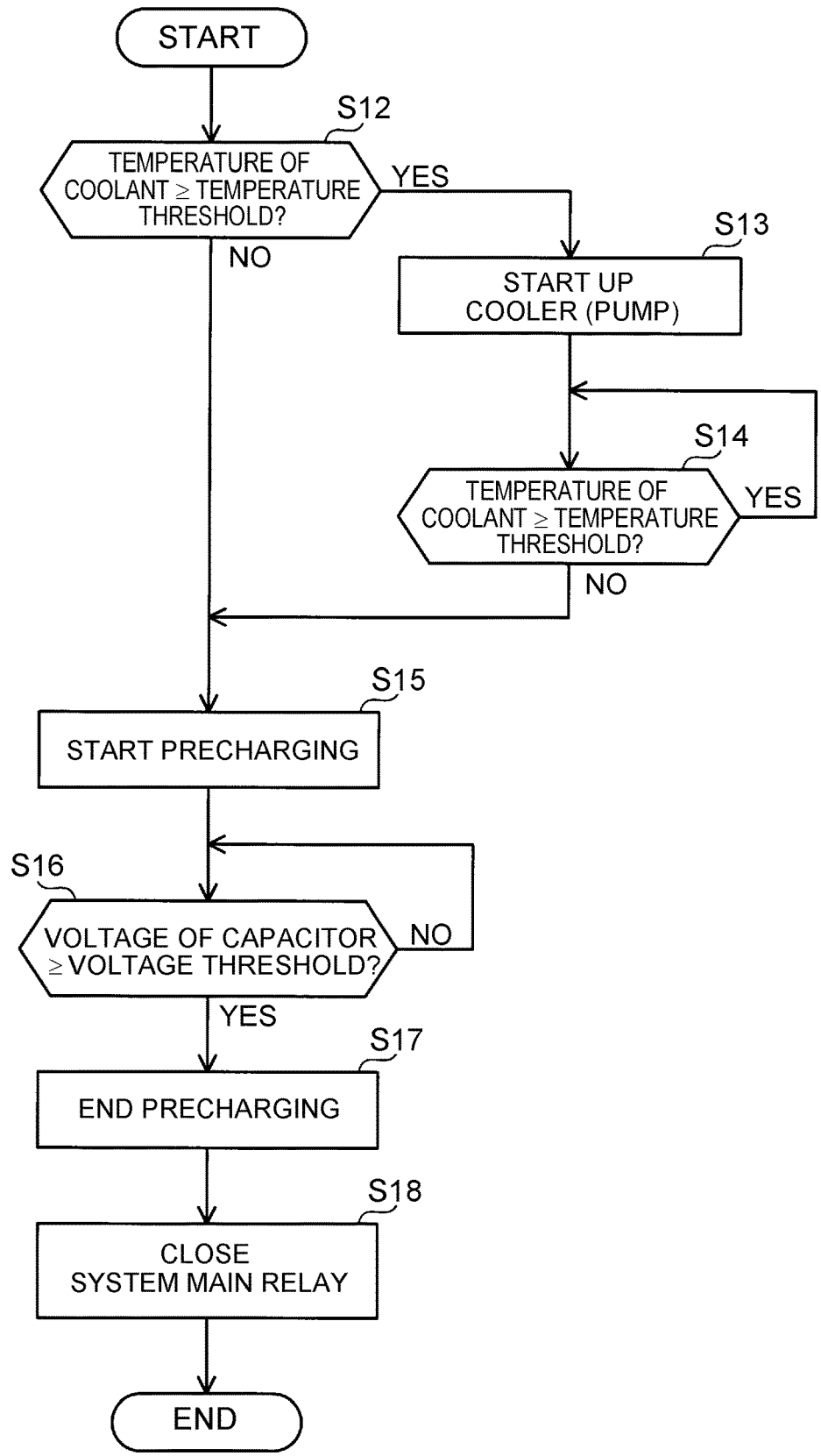
FIG. 3 is a flowchart of a precharging process in a first modification.

In the power supply system 2 of the embodiment, the controller 7 compares the temperature of the boost converter 5 with the temperature threshold. The controller 7 may compare the temperature of the coolant, instead of the temperature of the boost converter 5, with a temperature threshold in a first modification. FIG. 3 illustrates a flowchart of a precharging process in the first modification. The controller 7 acquires the temperature of the coolant from the temperature sensor 42, and compares the temperature with a temperature threshold (step S12). When the temperature of the coolant is less than the temperature threshold, the controller 7 immediately starts precharging (step S12: NO, S15). A subsequent process (steps S15 to S18) is the same as the process of steps S5 to S8 in FIG. 2.

Meanwhile, when the temperature of the coolant exceeds the temperature threshold, the controller 7 starts up the cooler 30 (pump 32) (step S12: YES, S13). The controller 7 waits until the coolant temperature becomes less than the temperature threshold (step S14: YES). Once the temperature of the coolant becomes less than the temperature threshold, the controller 7 starts precharging (step S14: NO, S15). A subsequent process (steps S15 to S18) is the same as the process (steps S5 to S8) in the flowchart of FIG. 2. The effect similar to that in the first embodiment can also be achieved in the precharging process in the first modification.

Figure 4:
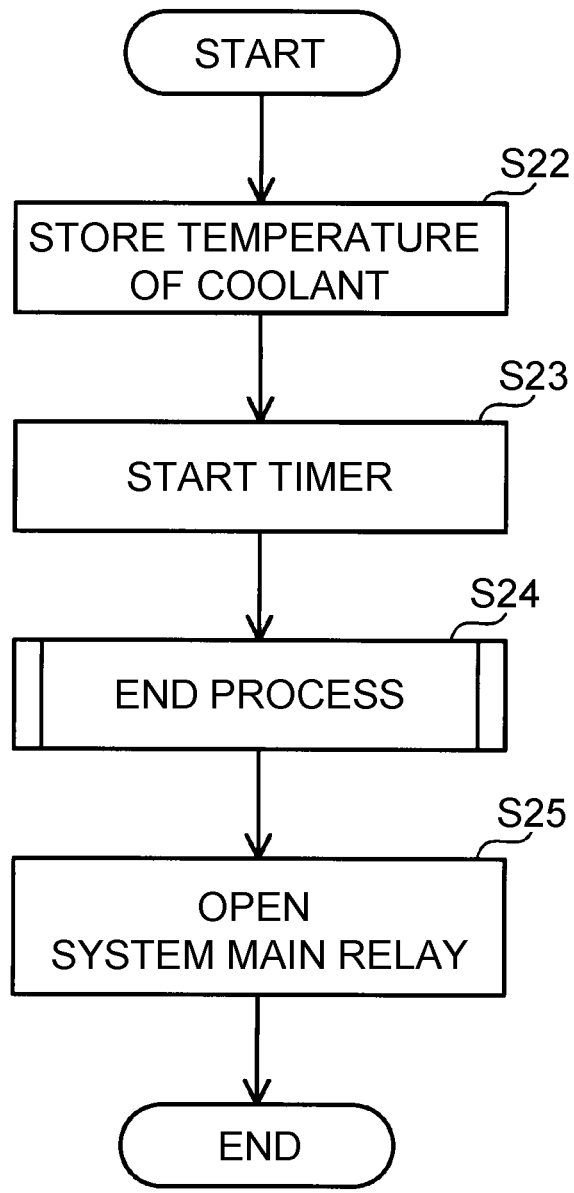
FIG. 4 is a flowchart of a process at the time of turning off the main switch in a second modification.
Figure 5:
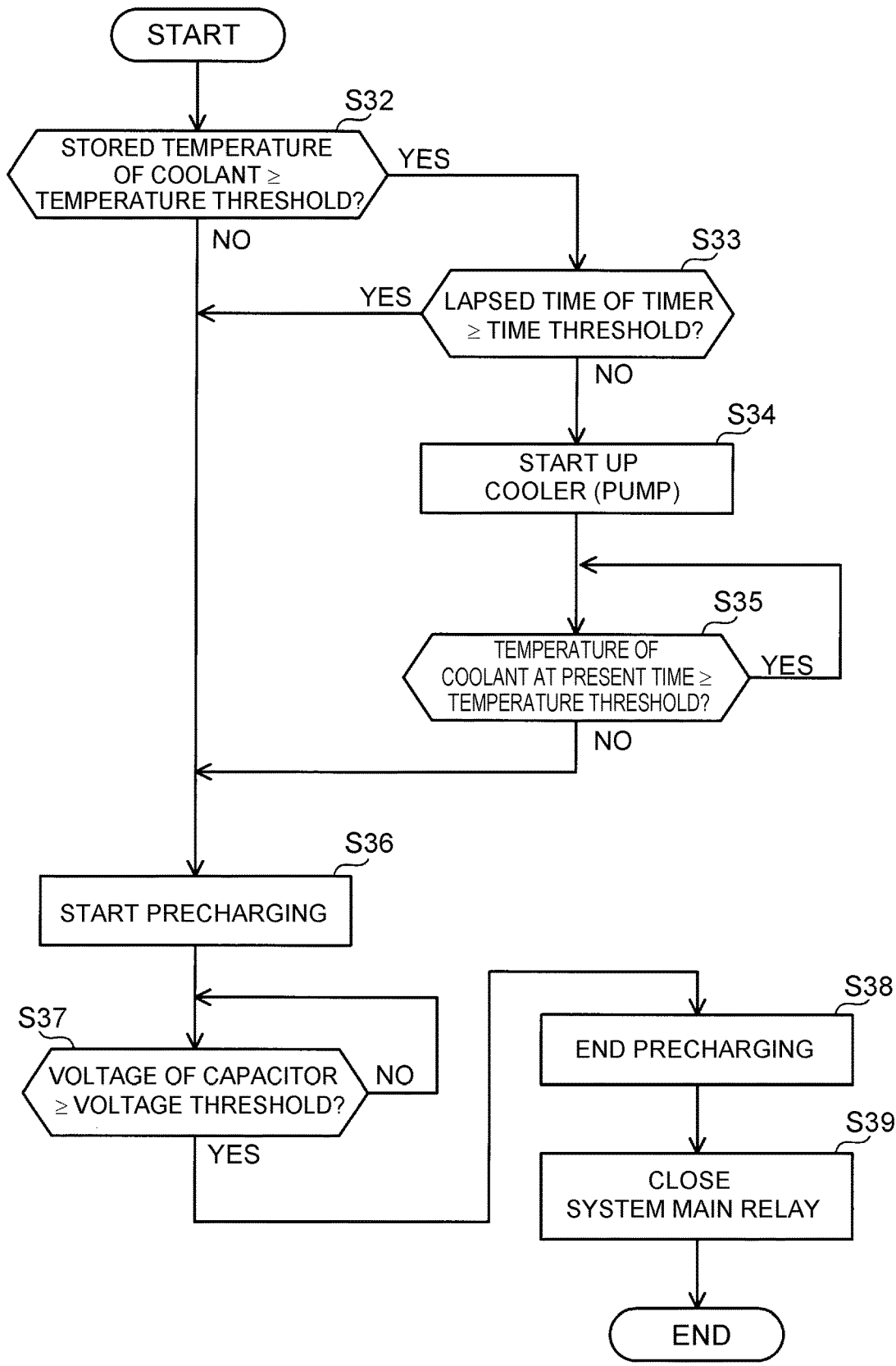
FIG. 5 is a flowchart of a precharging process in the second modification.

In the precharging processes in the embodiment and the first modification, the controller 7 compares the temperature of the boost converter 5 (or the temperature of the coolant) after the main switch 8 is turned on with the temperature threshold. Instead of the temperature of the boost converter 5 (or the temperature of the coolant) after the main switch 8 is turned on, the temperature of the boost converter 5 (or the temperature of the coolant) when the main switch 8 was turned off last time may be used in a second modification. FIG. 5 illustrates a flowchart of a precharging process in the second modification. FIG. 4 illustrates a flowchart of a precharging preparation process in the second modification. The preparation process is the process performed when the main switch 8 is turned off.

With reference to FIG. 4, the process when the main switch 8 is turned off will be described. When the main switch 8 is turned off, the controller 7 stores the temperature of the coolant (step S22). The temperature of the coolant is acquired from the temperature sensor 42. Next, the controller 7 starts a timer (step S23). The controller 7 then executes various kinds of end processes, and opens the system main relay at the end (steps S24, S25). Since the timer operates upon reception of electric power supplied from the sub-battery 6, the timer continuously operates even after the system main relay 4 is opened.

A description is now given of a precharging process in the second modification with reference to FIG. 5. The process of FIG. 5 is also started when the main switch 8 is turned on. The controller 7 compares the temperature of the coolant stored in previous step S22 (FIG. 4) with a temperature threshold (step S32). When the stored temperature of the coolant is less than the temperature threshold, the controller 7 immediately starts precharging (step S32: NO, S36). A process subsequent to step 36 is the same as the process subsequent to step 5 in FIG. 2.

Meanwhile, when the stored temperature of the coolant exceeds the temperature threshold, the controller 7 compares lapsed time of the timer with a time threshold (step S32: YES, S33). When the lapsed time of the timer exceeds the time threshold, the controller 7 starts precharging (step S33: YES, S36). The process subsequent to step 36 is the same as the process subsequent to step 5 in FIG. 2.

When the lapsed time of the timer is less than the time threshold, the controller 7 starts up the cooler 30 (pump 32) (step S33: NO, S34). The controller 7 then waits until the temperature of the coolant at the present time becomes less than the temperature threshold (step S35: YES). The temperature of the coolant at the present time can be acquired from the temperature sensor 42. Once the temperature of the coolant at the present time becomes less than the temperature threshold, the controller 7 starts precharging (step S35: NO, S36). The process subsequent to step 36 is the same as the process subsequent to step 5 in FIG. 2.

In the second modification, the process of step S32 uses the stored temperature without requiring the measurement value of the temperature sensor, which leads to fast processing. When the stored temperature is lower than the temperature threshold, the controller 7 can swiftly start precharging.

In the precharging process in the second modification, the measurement time of the timer is used in step S33. When the measurement time of the timer exceeds the time threshold, the temperature of the coolant (i.e., the temperature of the boost converter 5) is sufficiently low. In that case, the controller 7 starts precharging without starting up the cooler 30. When the measurement time of the timer is less than the time threshold, there is a high possibility that the temperature of the coolant (i.e., the temperature of the boost converter 5) is not sufficiently low. In that case, the controller 7 starts up the cooler 30 (pump 32) before precharging.

The time threshold in step S33 may be set in accordance with the stored temperature of the coolant. Specifically, a longer time threshold may adequately be set as the stored temperature of the coolant is higher.

The temperature of the coolant is adopted in the second modification. The coolant temperature may be replaced with the temperature of the boost converter 5.

The important points about the technique of the embodiment will be described. In the precharging process of the embodiment, when the temperature of the boost converter 5 was lower than a temperature threshold, the controller 7 started up the cooler 30, and started the precharging after the temperature of the boost converter 5 was lowered. That is, the controller 7 started up the cooler 30 before the precharging. In the flowchart of FIG. 2, the process of step S4 may be omitted, and the controller 7 may start up the cooler 30 while starting precharging. When the cooler 30 is started up, the temperature of the boost converter 5 is swiftly lowered, and thereby a heat load of the boost converter 5 can be suppressed. When the process of step S4 is omitted, the controller 7 does not need to wait until the temperature of the boost converter 5 becomes less than the temperature threshold. This also applies to the first modification and the second modification. That is, the process of step S14 may be omitted in the process of FIG. 3. Alternatively, the process of step S35 may be omitted in the process of FIG. 5.

The temperature of a cooling object of the cooler 30 may be used as an approximation value of the temperature of the coolant. For example, as illustrated in FIG. 1, the cooler 30 includes the temperature sensor 43 that measures the temperature of the oil cooler 35. The temperature of the oil cooler 35 measured by the temperature sensor 43 may be used as an approximation value of the temperature of the coolant. Alternatively, the temperature of the coolant oil cooled by the oil cooler 35 may be used as an approximation value of the temperature of the coolant flowing through the coolant circulation path 31.

The main battery 3 of the embodiment is one example of a main power supply. The main power supply may be a fuel cell. The sub-battery 6 of the embodiment is one example of a sub power supply.

Although specific examples of the present embodiment have been described in detail in the foregoing, they are merely illustrative and are not intended to restrict the claims of the disclosure. The technique described in the claims includes various modifications and deformations of the specific examples illustrated in the foregoing. The technological components described in this specification or in the drawings demonstrate technical usefulness independently or in various kinds of combinations, and are not limited to the combinations disclosed in the claims at the time of filing application. The technique disclosed in this specification or in the drawings can concurrently achieve a plurality of objects. Accomplishing one of the objects itself provides the technical usefulness thereof.

What is claimed is:

1. A power supply system for a vehicle, the power supply system comprising:
a main power supply;
an electric power converter configured to convert output electric power of the main power supply, the electric power converter including a capacitor connected between a positive electrode of the main power supply and a negative electrode of the main power supply;
a relay configured to switch connection and disconnection between the electric power converter and the main power supply;
a sub power supply having an output voltage lower than an output voltage of the main power supply;
a boost converter including a low voltage end connected to the sub power supply and a high voltage end connected to the capacitor;
a cooler configured to cool the boost converter; and
a processor programmed to:
cause the sub power supply and the boost converter to precharge the capacitor when a main switch of the vehicle is turned on, such that the sub power supply and the boost converter precharge the capacitor before the relay is closed to connect the electric power converter to the main power supply;
when the main switch is turned on, perform one of a control i) and a control ii) when one of a temperature of the boost converter and a temperature of a coolant in the cooler is higher than a specified temperature threshold, the control i) being to start the precharging while starting the cooler, and the control ii) being to start the cooler before the precharging.

2. The power supply system according to claim 1, wherein the processor is programmed to perform one of the control i) and the control ii) when a condition a) and a condition b) are both satisfied,
the condition a) is that one of the temperature of the boost converter and the temperature of the coolant when the main switch was last turned off is higher than the temperature threshold, and
the condition b) is that lapsed time since the main switch was last turned off is shorter than a specified threshold time.

3. A control method of a power supply system, the power supply system including: a main power supply; an electric power converter including a capacitor connected between a positive electrode of the main power supply and a negative electrode of the main power supply, the electric power converter being configured to convert output electric power of the main power supply; a relay configured to switch connection and disconnection between the electric power converter and the main power supply; a sub power supply having an output voltage lower than an output voltage of the main power supply; a boost converter having a low voltage end connected to the sub power supply and a high voltage end connected to the capacitor; a cooler configured to cool the boost converter; and a processor programmed to cause the sub power supply and the boost converter to precharge the capacitor when a main switch is turned on, such that the sub power supply and the boost converter precharge the capacitor before the relay is closed to connect the electric power converter to the main power supply, the control method being performed by the processor and comprising:
determining whether the main switch is turned on; and when the main switch is turned on, performing one of a control i) and a control ii), when one of a temperature of the boost converter and a temperature of a coolant in the cooler is higher than a specified temperature threshold, the control i) being to start the precharging while starting the cooler, and the control ii) being to start the cooler before the precharging.

* * * * *